United States Patent
Cho et al.

(10) Patent No.: US 7,505,661 B2
(45) Date of Patent: Mar. 17, 2009

(54) OPTICAL WAVEGUIDE, PACKAGE BOARD HAVING THE SAME, AND MANUFACTURING METHOD THEREOF

(75) Inventors: Han-Seo Cho, Daejeon (KR); Je-Gwang Yoo, Yongin-si (KR); Joon-Sung Kim, Suwon-si (KR); Sang-Hoon Kim, Gunpo-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/078,948

(22) Filed: Apr. 8, 2008

(65) Prior Publication Data
US 2009/0028494 A1    Jan. 29, 2009

(30) Foreign Application Priority Data
Jul. 26, 2007    (KR) .................. 10-2007-0074972

(51) Int. Cl.
*G02B 6/10* (2006.01)
*H01L 21/00* (2006.01)

(52) U.S. Cl. .................. 385/129; 385/130; 385/131; 385/14; 385/47; 438/29; 438/31

(58) Field of Classification Search ......... 385/129–131, 385/14, 47; 438/29, 31
See application file for complete search history.

(56) References Cited

U.S. PATENT DOCUMENTS

| | | | | |
|---|---|---|---|---|
| 5,263,111 A * | 11/1993 | Nurse et al. | ................. | 385/130 |
| 5,387,269 A * | 2/1995 | Nijander et al. | ................ | 65/386 |
| 6,542,671 B1 * | 4/2003 | Ma et al. | ...................... | 385/47 |
| 7,125,176 B1 * | 10/2006 | Stafford et al. | ................ | 385/94 |
| 7,346,242 B2 * | 3/2008 | Morlion et al. | ................ | 385/52 |
| 7,366,375 B2 * | 4/2008 | Ohtorii | ........................ | 385/33 |
| 2008/0037929 A1 * | 2/2008 | Kim et al. | ..................... | 385/14 |

\* cited by examiner

*Primary Examiner*—Brian Healy
*Assistant Examiner*—Guy G Anderson

(57) ABSTRACT

An optical waveguide, a package board having the optical waveguide, and manufacturing methods thereof are disclosed. The method of manufacturing an optical waveguide includes: forming a first reflective bump and a second reflective bump, which have inclined surfaces formed on sides opposite to each other and which are disposed with a predetermined distance in-between, on one side of a first cladding; forming a core between the first reflective bump and the second reflective bump; and stacking a second cladding over the one side of the first cladding such that the second cladding covers the first reflective bump, the second reflective bump, and the core. With this method, inclined surfaces can be formed by stacking a metal layer on the lower cladding and then selectively etching the metal layer, which can reduce lead time and enable a high degree of freedom in design.

23 Claims, 23 Drawing Sheets

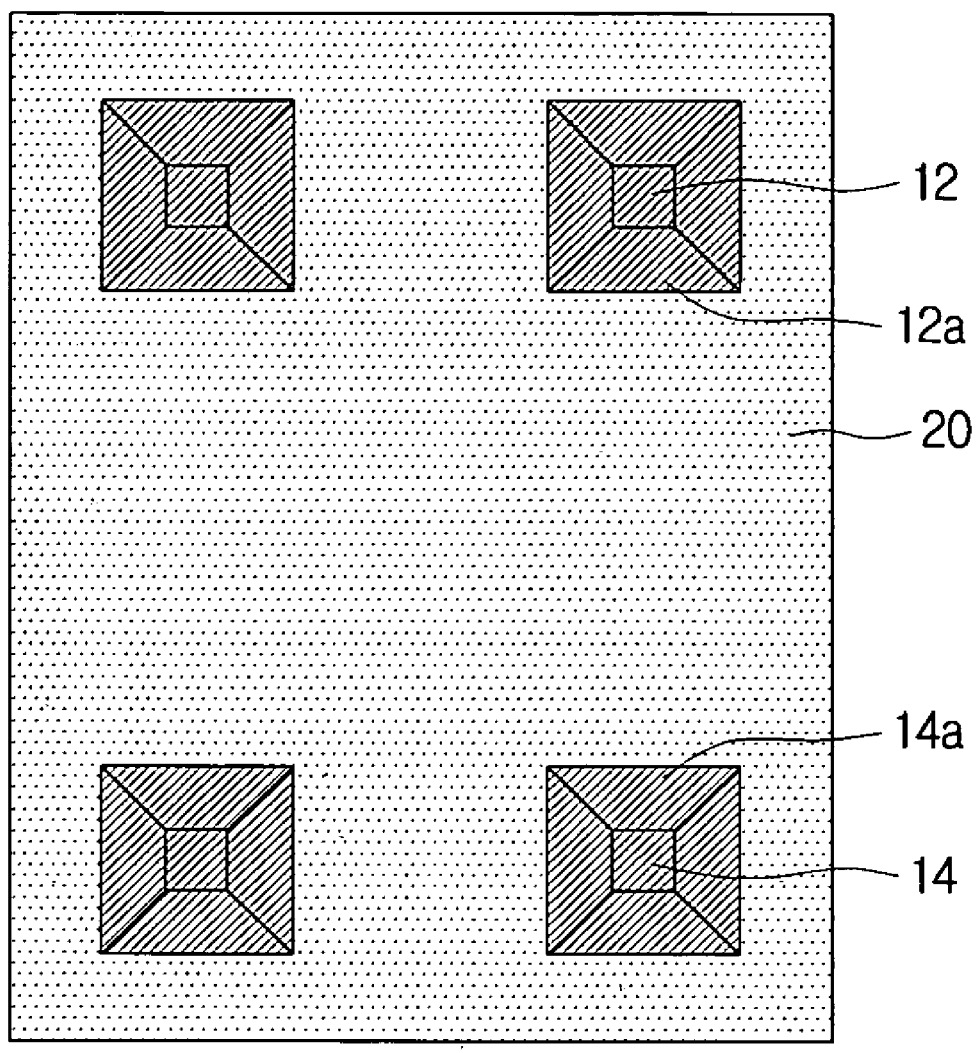

OPTICAL WAVEGUIDE, PACKAGE BOARD HAVING THE SAME, AND MANUFACTURING METHOD THEREOF

CROSS-REFERENCE TO RELATED APPLICATIONS

This application claims the benefit of Korean Patent Application No. 10-2007-0074972 filed with the Korean. Intellectual Property Office on Jul. 26, 2007, the disclosure of which is incorporated herein by reference in its entirety.

BACKGROUND

1. Technical Field

The present invention relates to an optical waveguide, a package board having the optical wave guide, and methods of manufacturing thereof.

2. Description of the Related Art

With the recent developments in computers and communication technology, the transfer speed of signals has become an important parameter. Accordingly, impedance matching between the components and the wiring is becoming important in a high-frequency package board.

The package board used a conductive metal such as copper, etc., for the electrical wiring, as a medium for the transfer of signals, there was a limit to transmitting data at ultra-high speeds and in high capacities. As a method of overcoming this problem, the optical package board was developed, in which an optical waveguide of a particular size is formed directly in a silicon substrate, which is then mounted on a package board.

That is, in the past, the method used in manufacturing a package board included forming circuit patterns on a copper plate to form the inner and outer layers of a package board, but recently, the method is being used of inserting in the package board an optical waveguide, which is capable of exchanging signals by light using polymers and glass fibers.

Here, an optical waveguide refers to a means for transmitting optical signals that consists of a center portion having a high refractive index, known as the core, and a surrounding portion having a low refractive index, known as the cladding. When an optical signal enters such an optical waveguide, the incident optical signal undergoes repeated total reflection at the boundary between the core and cladding, which allows the optical signal to travel through the core.

The materials for optical fibers include glass fibers and plastic fibers, where glass fibers can be subdivided into quartz type glass fibers and multi-element glass fibers. For communication uses, quartz type glass fibers are mainly used, which provide lower losses, while plastic fibers are commonly used for transmitting light energy, as lighting devices or decorations.

A typical manufacturing method for an optical waveguide includes the stacking-type method, in which the core is formed over a lower cladding layer, after which the core is processed to form an inclined surface, and then an upper cladding layer is formed.

With this method, however, a separate dicing process may be required, in order to form the inclined surface which alters the paths of optical signals. Moreover, in cases where several inclined surfaces are to be formed, the dicing process may be repeated a corresponding number of times, greatly degrading production efficiency.

SUMMARY

An aspect of the invention is to provide an optical waveguide, a package board having the optical waveguide, and methods for manufacturing the optical waveguide and the package board, in which the optical waveguide is formed by processes commonly used in manufacturing a package board, such as stacking and etching.

One aspect of the invention provides a method of manufacturing an optical waveguide. The method includes: forming a first reflective bump and a second reflective bump, which have inclined surfaces formed on sides opposite to each other and which are disposed with a predetermined distance in-between, on one side of a first cladding; forming a core between the first reflective bump and the second reflective bump; and stacking a second cladding over the one side of the first cladding such that the second cladding covers the first reflective bump, the second reflective bump, and the core.

Forming the first reflective bump and the second reflective bump may be achieved by stacking a metal layer on the one side of the first cladding; forming an etching resist corresponding to the first reflective bump and the second reflective bump over one side of the metal layer; selectively etching the metal layer by applying an etchant to the metal layer; and removing the etching resist.

Forming the core can be achieved by forming a polymer resin layer on the one side of the first cladding; and selectively removing the polymer resin layer.

Before forming the core, the method may further include polishing a surface of the first reflective bump. Also, before polishing the surface of the first reflective bump, the method may further include forming a common electrode on the one side of the first cladding; forming a first lead, such that the first reflective bump and the common electrode are electrically connected; and forming a second lead, such that the second reflective bump and the common electrode are electrically connected. Here, the common electrode can be formed along an edge of the first cladding.

Another aspect of the invention provides an optical waveguide, which includes: a first cladding; a first reflective bump and a second reflective bump, on opposing sides of which inclined surfaces are formed, and which are disposed with a predetermined distance in-between; a core formed between the first reflective bump and the second reflective bump; and a second cladding stacked over the one side of the first cladding and covering the first reflective bump, the second reflective bump, and the core.

The first reflective bump can be made of a metallic material.

The optical waveguide can additionally include a common electrode formed on the first cladding; a first lead that electrically connects the first reflective bump and the common electrode; and a second lead that electrically connects the second reflective bump and the common electrode, where the common electrode can be formed along an edge of the first cladding.

Still another aspect of the invention provides a method of manufacturing a package board. This method includes: forming a first reflective bump and a second reflective bump, which have inclined surfaces formed on opposing sides, and which are disposed with a predetermined distance in-between; forming a core between the first reflective bump and the second reflective bump; stacking a second cladding over the one side of the first cladding, such that the second cladding covers the first reflective bump, the second reflective bump, and the core; forming a pad and a first circuit pattern on one side of the second cladding; and placing an optical component on the pad.

Forming the first reflective bump and the second reflective bump may be achieved by stacking a metal layer on the one side of the first cladding; forming an etching resist corresponding to the first reflective bump and the second reflective bump over one side of the metal layer; selectively etching the metal layer by applying an etchant to the metal layer; and removing the etching resist.

Forming the core can be achieved by forming a polymer resin layer on the one side of the first cladding; and selectively removing the polymer resin layer.

Before forming the core, the method may further include polishing a surface of the first reflective bump. Also, before polishing the surface of the first reflective bump, the method may further include forming a common electrode on the one side of the first cladding; forming a first lead, such that the first reflective bump and the common electrode are electrically connected; and forming a second lead, such that the second reflective bump and the common electrode are electrically connected. Here, the common electrode can be formed along an edge of the first cladding.

In the space between the optical component and the second cladding, underfilling may be performed using a transparent material, and before forming the first reflective bump and the second reflective bump, a carrier of a metallic material may be stacked on the other side of the first cladding. Afterwards, the carrier may be selectively etched to form a second circuit pattern.

Yet another aspect of the invention provides a package board, which includes: a first cladding; a first reflective bump and a second reflective bump, on opposing sides of which inclined surfaces are formed, and which are disposed with a predetermined distance in-between; a core formed between the first reflective bump and the second reflective bump; a second cladding stacked over the one side of the first cladding and covering the first reflective bump, the second reflective bump, and the core; a pad and a first circuit pattern formed on the second cladding; and an optical component placed on the pad.

The first reflective bump can be made of a metallic material.

The package board may additionally include a common electrode formed on the first cladding; a first lead that electrically connects the first reflective bump and the common electrode; and a second lead that electrically connects the second reflective bump and the common electrode, where the common electrode may be formed along an edge of the first cladding.

Additional aspects and advantages of the present invention will be set forth in part in the description which follows, and in part will be obvious from the description, or may be learned by practice of the invention.

BRIEF DESCRIPTION OF THE DRAWINGS

FIG. 3 is a plan view illustrating the reflective bumps.

DETAILED DESCRIPTION

Figure 1:
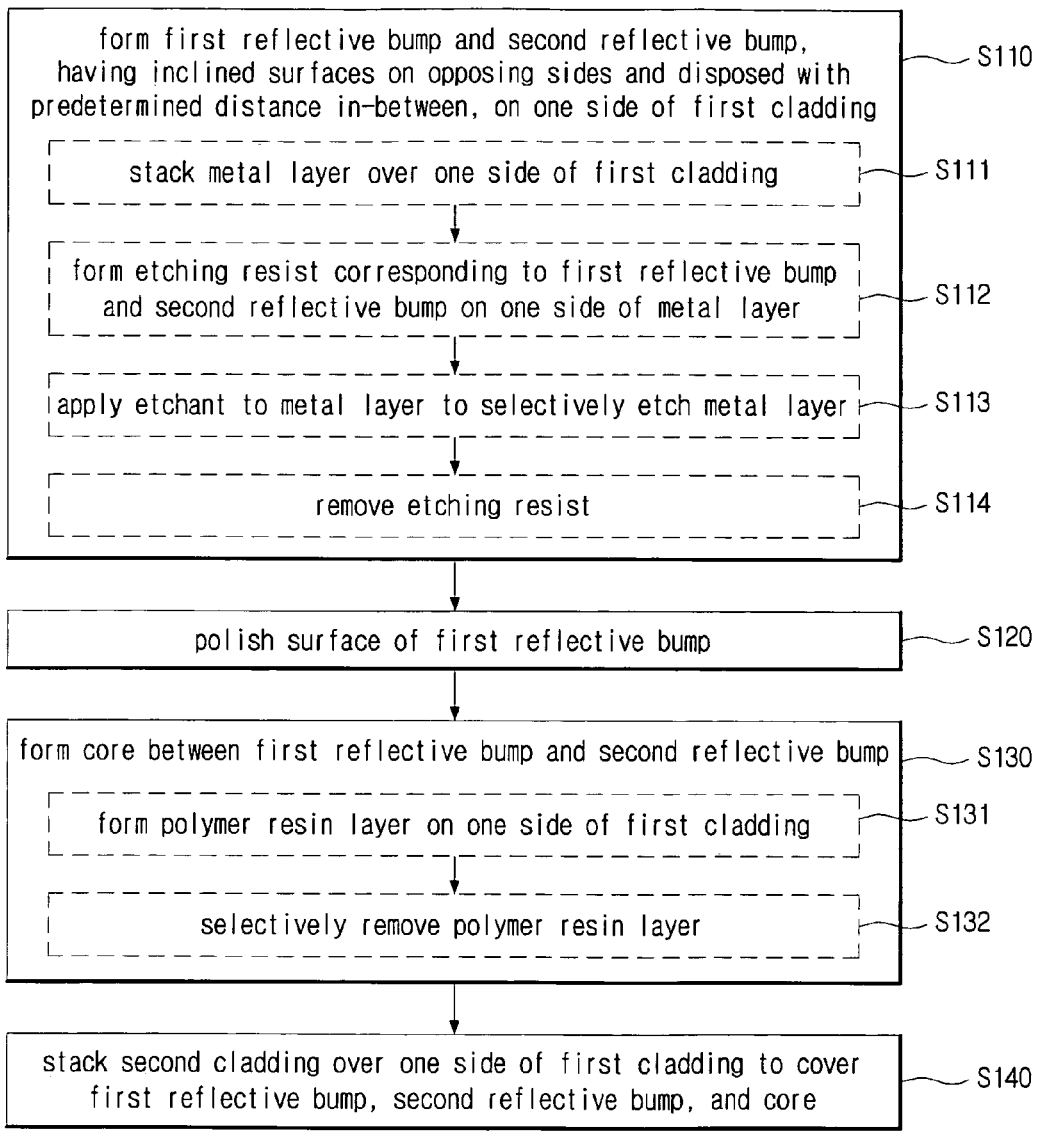
FIG. 1 is a flowchart illustrating an embodiment of a method of manufacturing an optical waveguide according to an aspect of the present invention.

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The optical waveguide, package board, and methods of manufacturing thereof according to certain embodiments of the invention will be described below in more detail with reference to the accompanying drawings. Those components that are the same or are in correspondence are rendered the same reference numeral regardless of the figure number, and redundant explanations are omitted.

A manufacturing method for an optical waveguide according to an aspect of the invention will first be described as follows.

FIG. 1 is a flowchart illustrating an embodiment of a method of manufacturing an optical waveguide according to an aspect of the present invention, and FIG. 2A through FIG. 2G are cross-sectional views representing a process diagram for the method of manufacturing an optical waveguide illustrated in FIG. 1. In FIGS. 2A to 2G are illustrated a metal layer 10, a first reflective bump 12, inclined surfaces 12a, 14a, a second reflective bump 14, a first cladding 20, an etching resist 30, a core 40, and a second cladding 50.

First, on one side of a first cladding 20, a first reflective bump 12 and a second reflective bump 14 are formed, on opposing sides of which inclined surfaces 12a, 14a are formed respectively, where the first reflective bump 12 and second reflective bump 14 are disposed with a predetermined distance in-between (S110). A more detailed description for this process will be described below as follows.

Figure 2A:
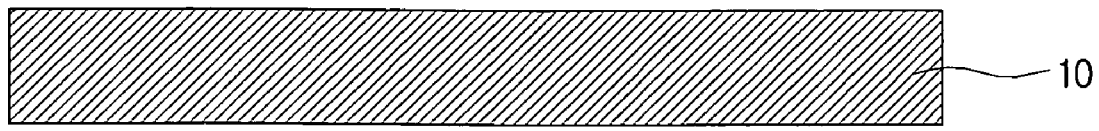
FIG. 2A, FIG. 2B, FIG. 2C, FIG. 2D, FIG. 2E, FIG. 2F, and FIG. 2G are cross-sectional views representing a process diagram for the method of manufacturing an optical waveguide illustrated in FIG. 1.
Figure 2B:
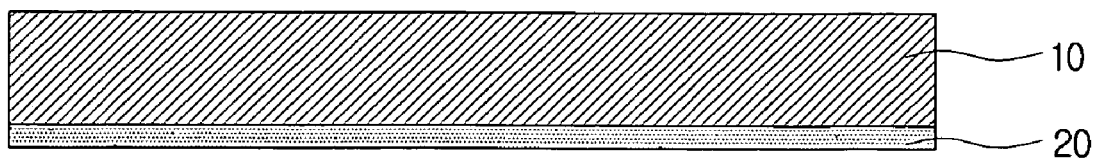

First, a metal layer 10 may be stacked on the one side of the first cladding 20 (S111). FIG. 2A illustrates the metal layer, and FIG. 2B illustrates the metal layer stacked over the first cladding.

Figure 2C:
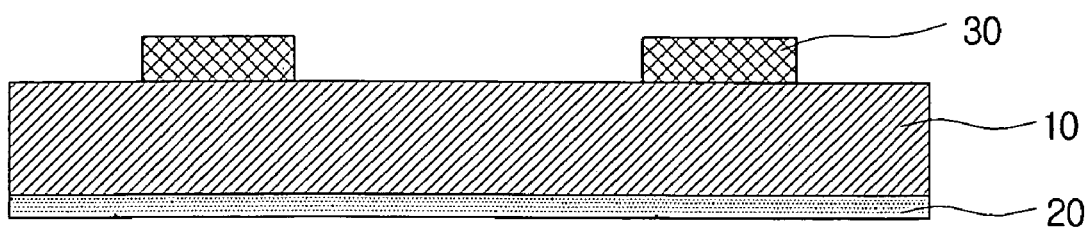

Next, on one side of the metal layer 10, an etching resist 30 corresponding to the first reflective bump 12 and second reflective bump 14 may be formed (S112). This may be achieved by performing exposure on the upper side of the metal layer 10 using photosensitive film (not shown) and a mask (not shown). The metal layer 10 with an etching resist 30 formed in such manner is illustrated in FIG. 2C.

Figure 2D:
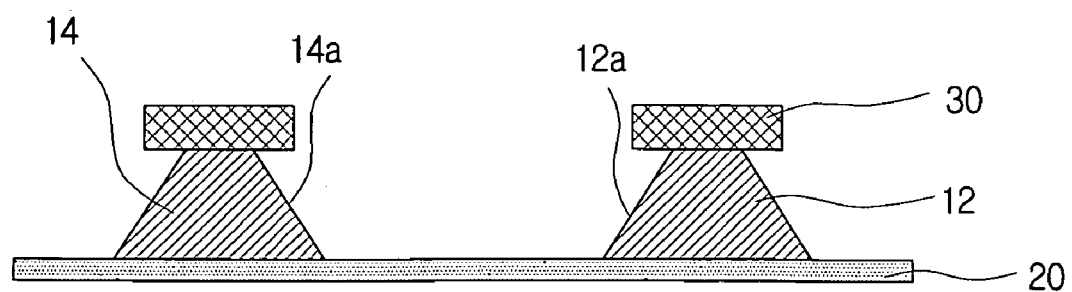
Figure 2E:
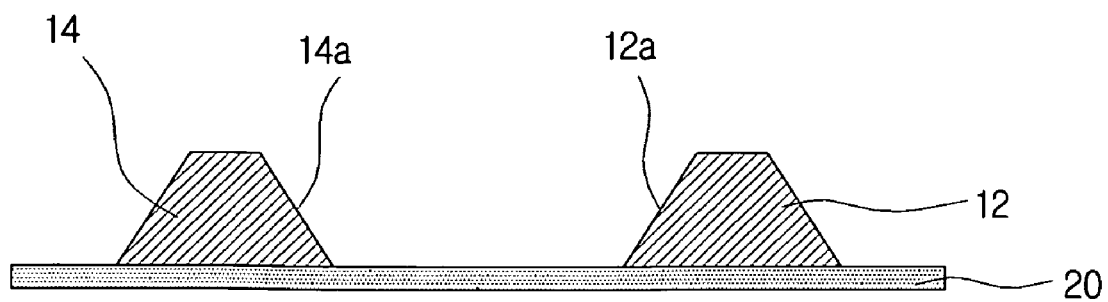

Next, an etchant may be applied to the metal layer 10 to selectively etch the metal layer 10 (S113), as illustrated in FIG. 2D, and then the etching resist 30 may be removed (S114). The configuration after the etching resist 30 is removed is illustrated in FIG. 2E.

By providing an etchant on the metal layer 10 having an etching resist 30 formed on the upper surface, the portions other than those covered by the etching resist 30 may be etched. After this process, the portions covered by the etching resist 30 can be made to have the shape of bumps, with inclined surfaces 12a, 14a formed on the sides. In this embodiment, these will be referred to as reflective bumps.

In FIG. 2D, multiple reflective bumps are shown. To distinguish between these, in this embodiment, a reflective bump positioned on the right will be referred to as a first reflective bump 12, while a reflective bump positioned on the right will be referred to as a second reflective bump 14.

Next, a process of polishing the surfaces of the first reflective bump 12 and second reflective bump 14 may be performed (S120). As the surfaces of the first reflective bump 12 and second reflective bump 14 may serve to alter the paths of optical signals, polishing the surfaces can prevent the optical signals from being dispersed. For this, a method such as electropolishing may be used.

Figure 4:
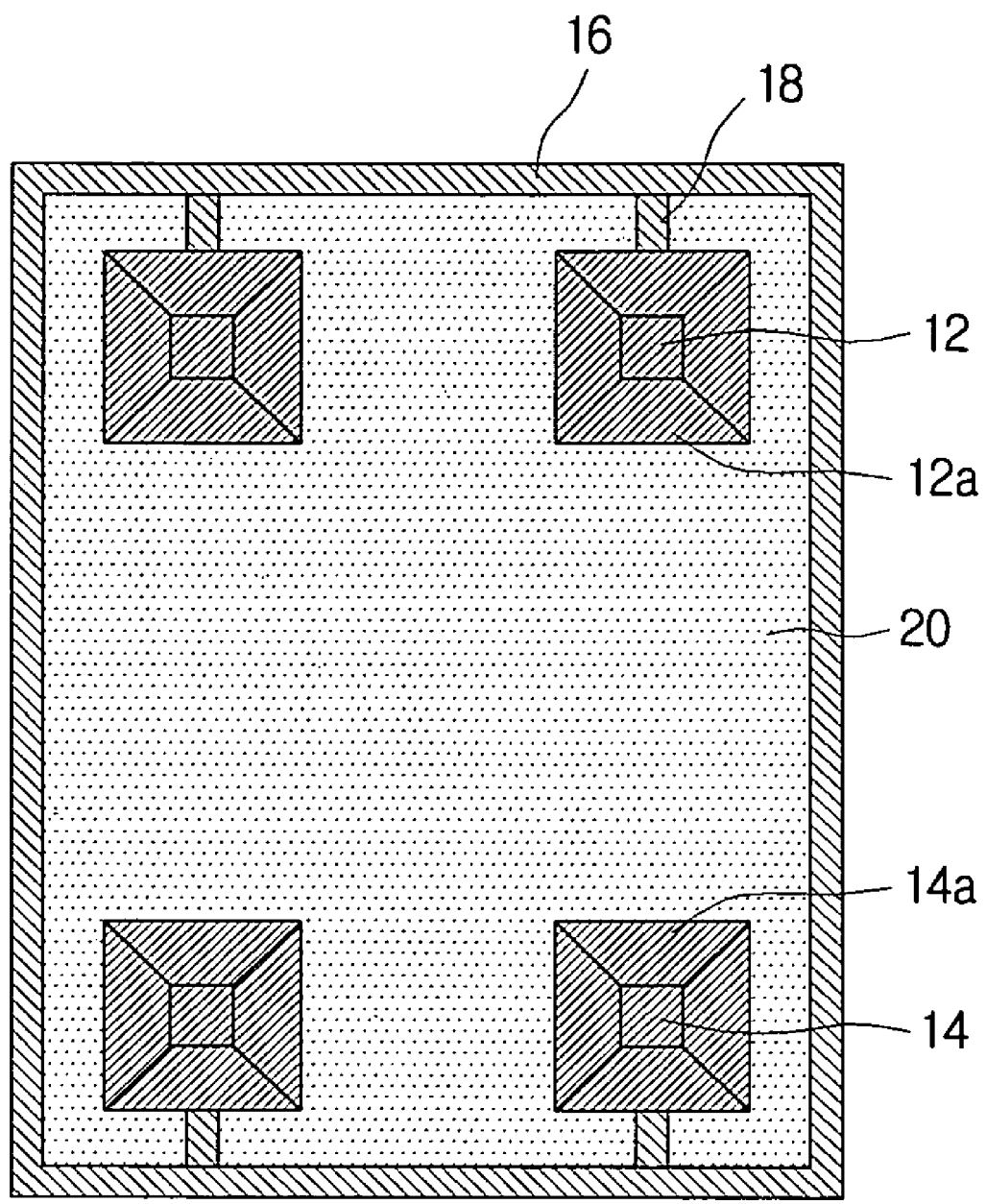
FIG. 4 is a plan view illustrating the common electrode and leads.

In order that such electropolishing may be performed more efficiently, a common electrode 16 and leads 18 can be formed before proceeding with the polishing. That is, as illustrated in FIG. 4, a common electrode 16 may be formed on the upper-surface of the first cladding 20, and a plurality of leads 18 may be formed such that each of the reflective bumps 12, 14 may be electrically connected with the common electrode 16.

After thus forming the common electrode 16 and the leads 18, supplying power to the common electrode 16 can result in a power supply to all of the reflective bumps 12, 14 connected to the common electrode 16, so that electropolishing can be performed in a greatly facilitated manner for each of the reflective bumps 12, 14.

In order to obviate the need for a separate process of removing the common electrode 16 and leads 18 described above after performing electropolishing, the common electrode 16 and the leads 18 can be patterned such that they do not affect the performance of the product. For example, the common electrode 16 may be formed along the edges of the first cladding 20, as illustrated in FIG. 4.

Figure 2F:
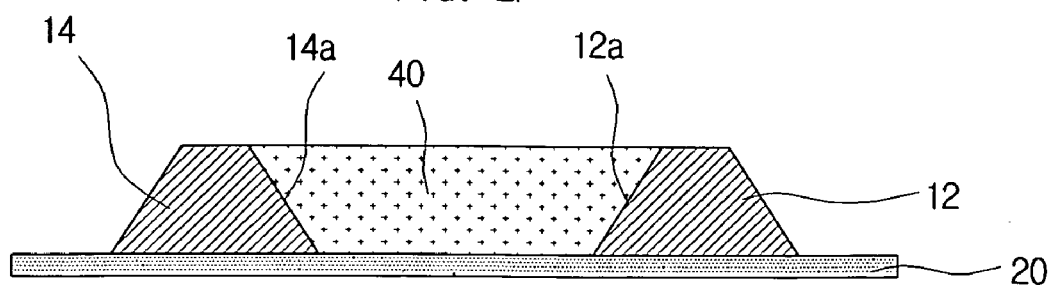

Next, as illustrated in FIG. 2F, a core 40 may be formed between the first reflective bump 12 and the second reflective bump 14 (S130). The core 40 may serve as a channel through which optical signals may travel. A more detailed description will be disclosed as follows, with regard to a method of forming the core 40.

Figure 5:
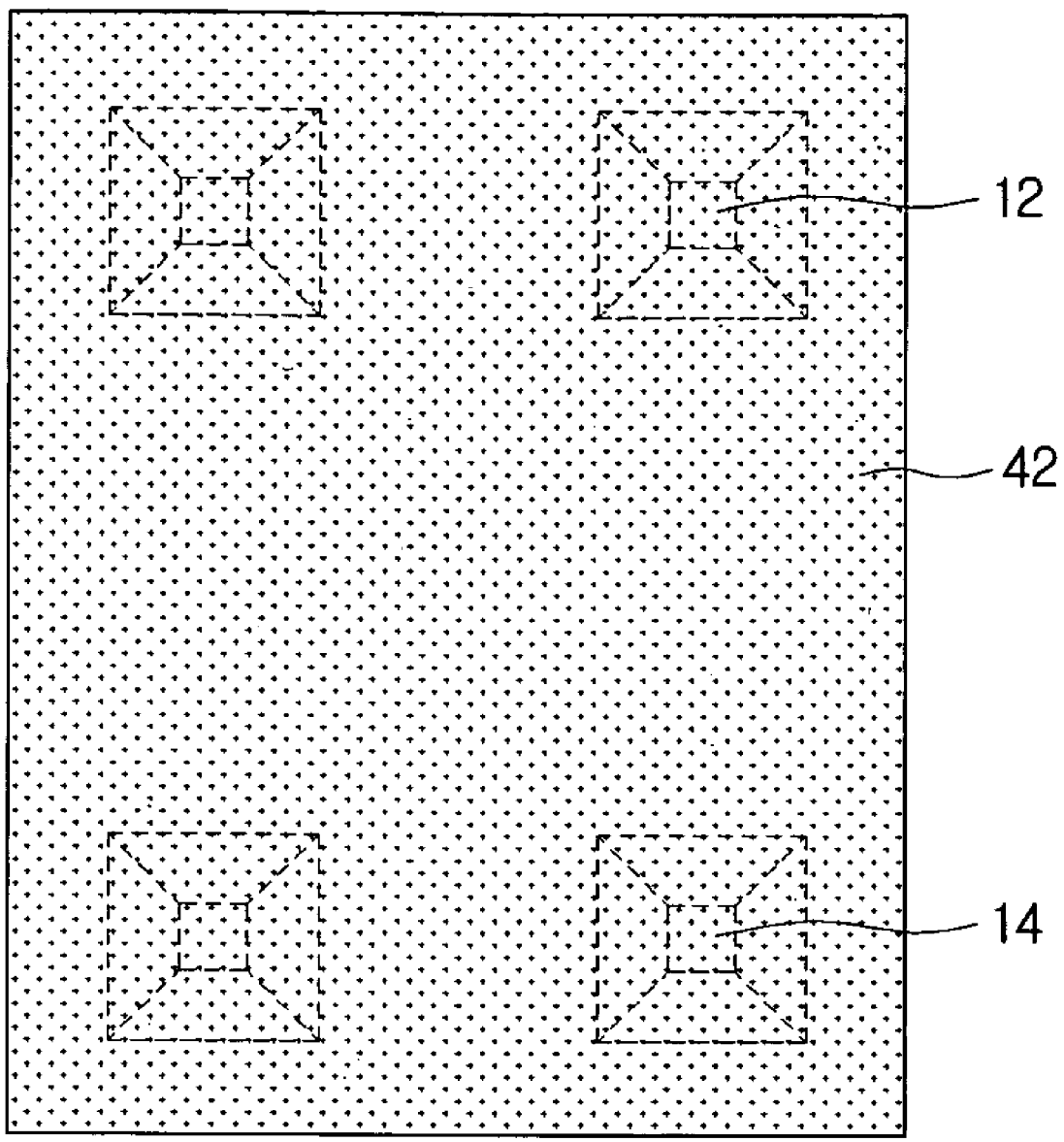
FIG. 5 is a plan view illustrating the polymer resin layer.

First, a polymer resin layer 42 may be formed on one side of the first cladding 20 (S131). A method used for this may be to stack a polymer film, such as a polyimide film, on the upper surface of the first cladding 20. A polymer resin layer 42 formed on the upper surface of the first cladding 20 in this manner is illustrated in FIG. 5.

Figure 6:
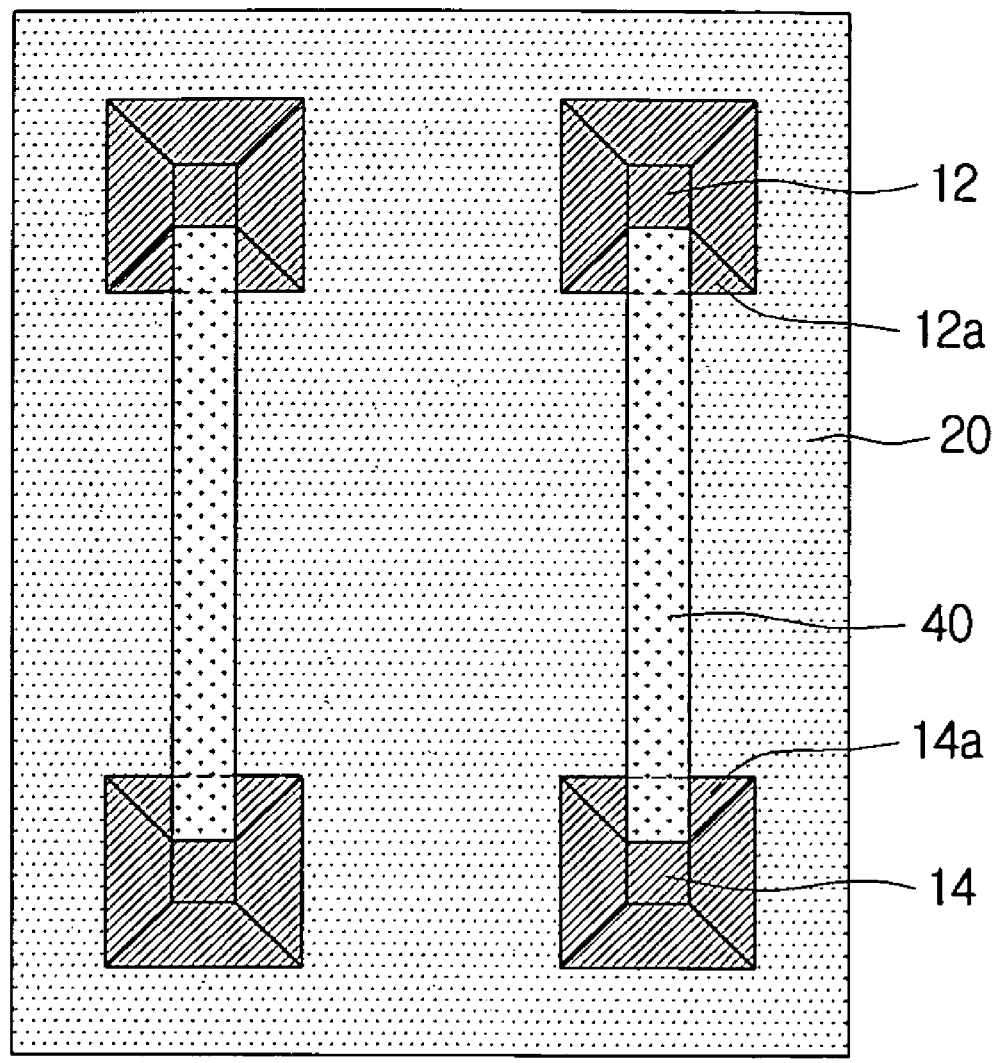
FIG. 6 is a plan view illustrating the core.

Next, the polymer resin layer 42 may be selectively removed (S132). The portions excluding the portions where the core 40 will be formed are removed, so that a core 40 may be formed between the first reflective bump 12 and the second reflective bump 14. A core 40 formed in this manner is illustrated in FIG. 6.

Figure 2G:
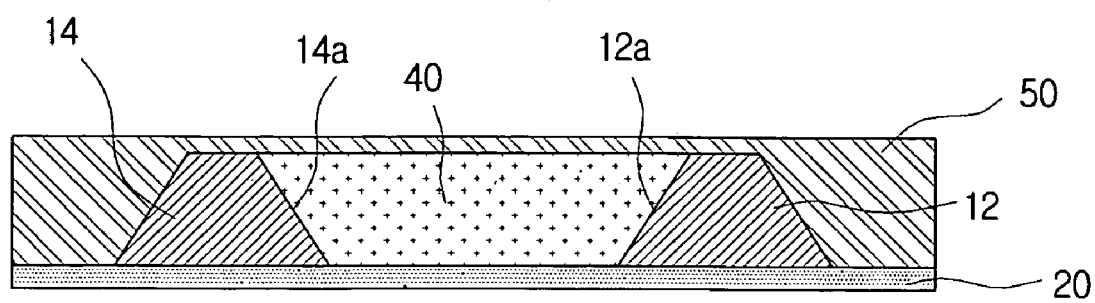
Figure 7:
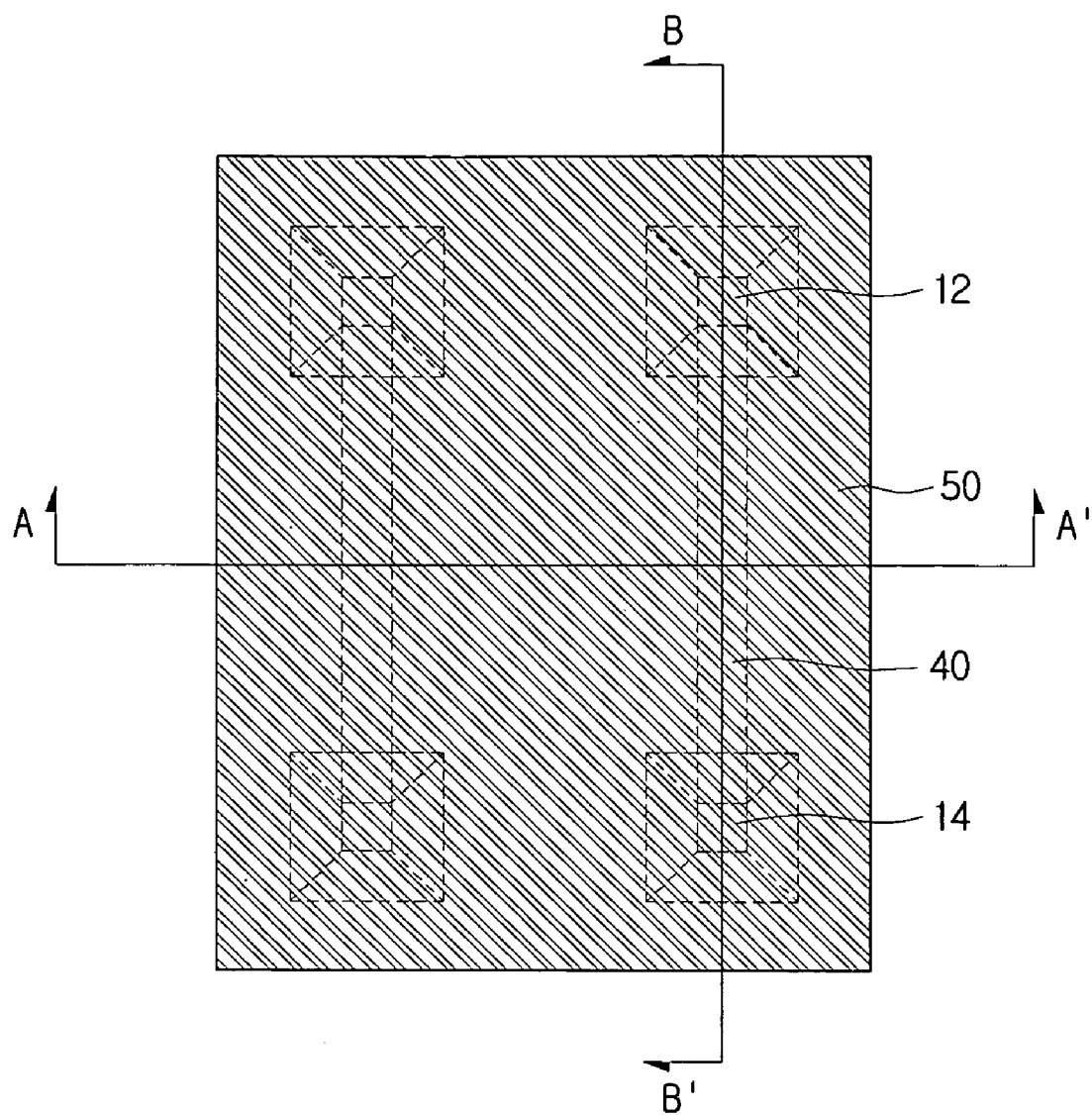
FIG. 7 is a plan view illustrating the second cladding.

Next, as illustrated in FIG. 2G and FIG. 7, a second cladding 50 may be stacked over the one side of the first cladding 20, to cover the first reflective bump 12, second reflective bump 14, and the core 40 (S140). Thus, the core 40 may be covered by the first cladding 20 and the second cladding 50.

Employing the method described above, an optical waveguide can be manufactured using techniques such as stacking, etching, etc., as used in the manufacturing of typical package boards.

Figure 8:
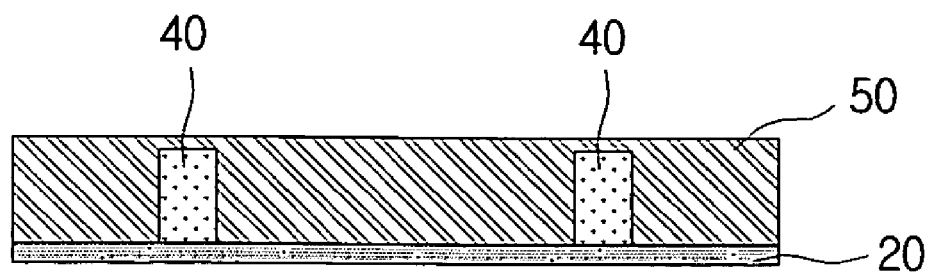
FIG. 8 is a cross-sectional view across line A-A' of FIG. 7.
Figure 9:
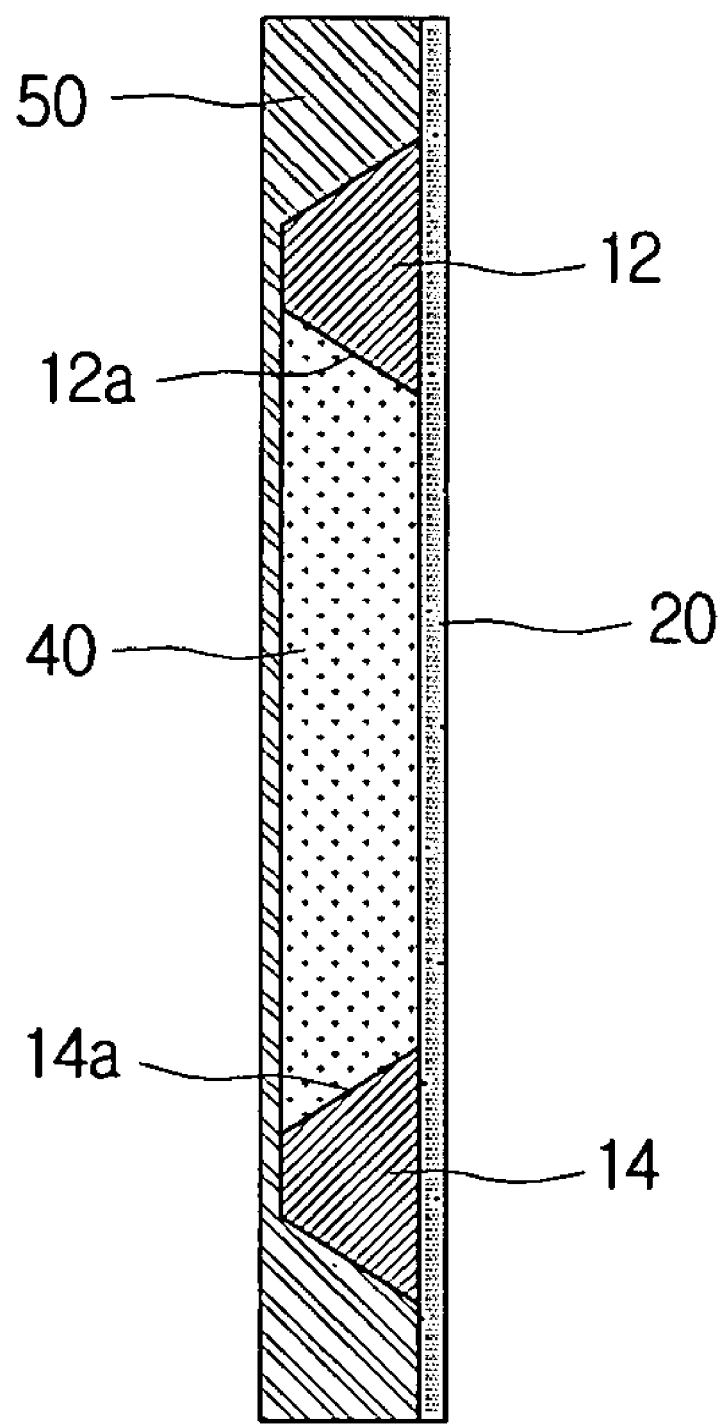
FIG. 9 is a cross-sectional view across line B-B' of FIG. 7.

The following will describe the structure of an optical waveguide manufactured by the method described above, with reference to FIG. 8 and FIG. 9. FIG. 8 is a cross-sectional view across line A-A' of FIG. 7, and FIG. 9 is a cross-sectional view across line B-B' of FIG. 7.

The core 40 may serve as a path through which optical signals are transferred, and may be surrounded by the cladding 20, 50. As described above, the core 40 can be made of a polymer based resin.

The cladding 20, 50 may surround the core 40 and may be designed to allow the efficient transmission of optical signals. Similar to the core 40, the cladding 20, 50 can be made of a polymer based resin, but may have a lower refractive index compared to that of the core 40, for the efficient transmission of optical signals.

In the embodiment described above for a method of manufacturing an optical waveguide, the cladding included a first cladding 20, on which the core 40 is placed, and a second cladding 50, which is stacked over the first cladding 20 to cover the core 40. However, it is to be appreciated that the structure of the cladding surrounding the core 40 may be implemented in a variety of forms.

A reflective bump may be formed adjacent to an end portion of the core 40, and may serve to alter the paths of optical signals provided from an optical component, etc., or transferred through the core 40. In this embodiment, the reflective bumps include first reflective bumps 12 and second reflective bumps 14, which are disposed with a predetermined gap in-between.

Figure 12A:
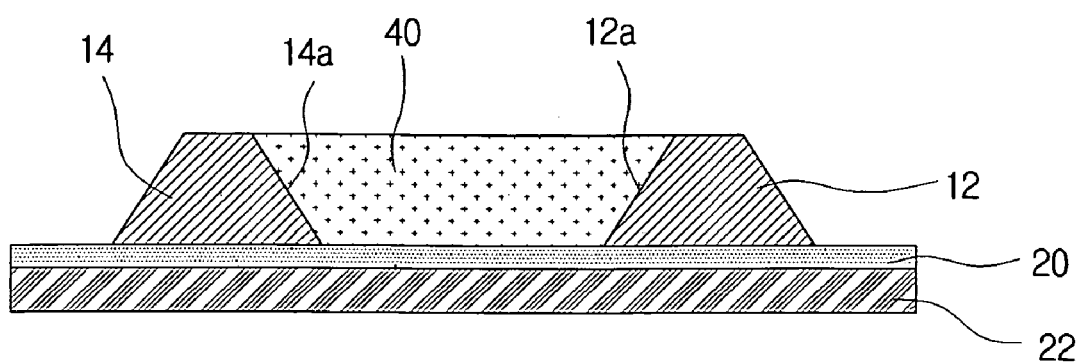
FIG. 12A, FIG. 12B, FIG. 12C, FIG. 12D, FIG. 12E, and FIG. 12F are cross-sectional views representing a process diagram for the method of manufacturing a package board illustrated in FIG. 10.

On the sides of the first reflective bump 12 and the second reflective bump 14 facing each other, inclined surfaces 12a, 14a can be formed which alter the paths of optical signals. Thus, when optical components 80a, 80b are mounted, as illustrated in FIG. 12F, the optical signals provided from the left optical component 80a may pass through the core 40 to be transmitted to the right optical component 80b.

As already described above, a common electrode 16 (see FIG. 4) and leads 18 (see FIG. 4) can be formed, to perform electropolishing in a more efficient manner.

Figure 10:
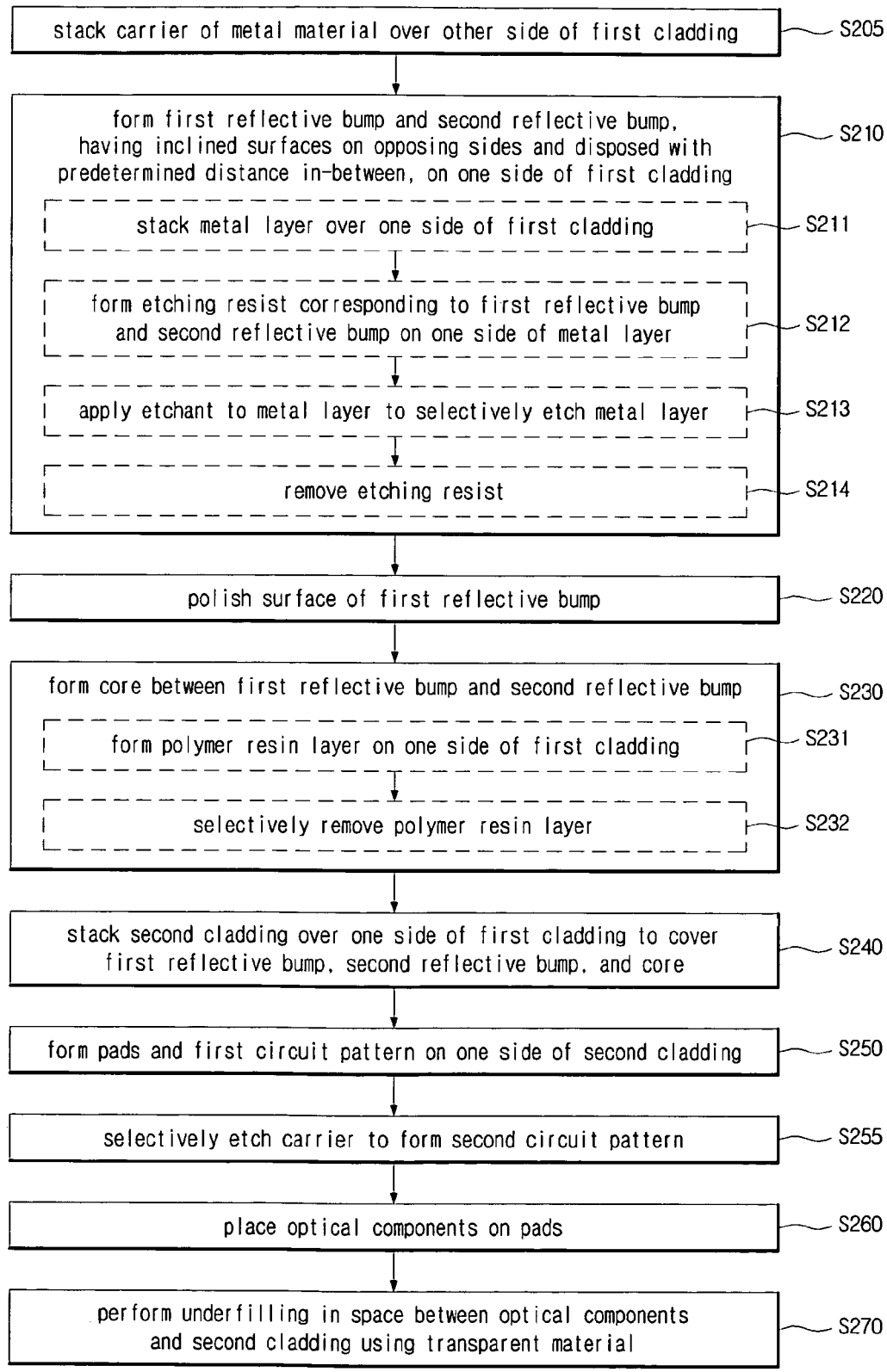
FIG. 10 is a flowchart illustrating an embodiment of a method of manufacturing a package board according to another aspect of the present invention.
Figure 11:
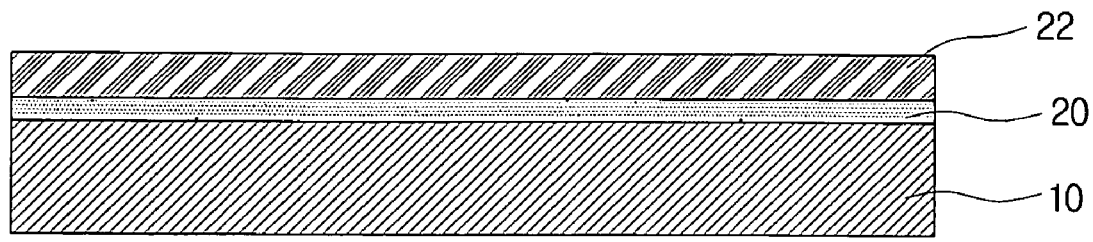
FIG. 11 is a cross-sectional view illustrating the carrier coupled to the first cladding.

Next, a manufacturing method for a package board according to another aspect of the invention will be described as follows. FIG. 10 is a flowchart illustrating an embodiment of a method of manufacturing a package board according to another aspect of the present invention, FIG. 11 is a cross-sectional view illustrating the carrier coupled to the first cladding, and FIG. 12A through FIG. 12F are cross-sectional views representing a process diagram for the method of manufacturing a package board illustrated in FIG. 10. In FIGS. 11 to 12F are illustrated a metal layer 10, a first reflective bump 12, inclined surfaces 12a, 14a, a second reflective bump 14, a first cladding 20, a carrier 22, a second circuit pattern 24, an etching resist 30, a core 40, a polymer resin layer 42, a second cladding 50, a metal layer 60, pads 62, a solder resist 70, optical components 80a, 80b, and underfill 90.

The method of manufacturing a package board according to this embodiment utilizes the manufacturing method for an optical waveguide disclosed above. This embodiment presents a manufacturing method for a package board, in which optical components 80a, 80b may be mounted on the optical waveguide described above, and circuit patterns may be formed, to manufacture the package board. As such, the descriptions will not be provided again in much detail for processes that are substantially the same as those that have been already been disclosed in describing the manufacturing method for an optical waveguide.

First, a carrier 22 of a metal material may be stacked over the other side of a first cladding 20 (S205). One reason can be that, when a thin polymer film is used for the first cladding 20, the configuration may not allow easy handling. By using the first cladding 20 coupled with the carrier 22, work efficiency can be increased in subsequent processes. In consideration of the process for forming circuit patterns, which will be described later in more detail, the carrier 22 can be made of a metal material. FIG. 11 shows an example of the carrier 22 stacked on the first cladding 20.

Next, a first reflective bump 12 and a second reflective bump 14 may be formed on one side of the first cladding 20 (S210), where the first reflective bump 12 and second reflective bump 14 have inclined surfaces 12a, 14a formed on opposite sides facing each other, and where a predetermined distance separates the first reflective bump 12 and second reflective bump 14.

This process can be performed by substantially the same method as that used for operation S110 illustrated in FIG. 1. That is, a metal layer 10 may be stacked on the one side of the first cladding 20 (S211), and an etching resist 30 corresponding to the first reflective bump 12 and second reflective bump 14 may be formed on one side of the metal layer 10 (S212), after which an etchant may be applied to the metal layer 10 to selectively etch the metal layer 10 (S213), and then the etching resist 30 may be removed (S214), to form the first reflective bump 12 and the second reflective bump 14.

Next, a process may be performed of polishing the surfaces of the first reflective bump 12 and second reflective bump 14 (S220). As the surfaces of the first reflective bump 12 and second reflective bump 14 may serve to alter the paths of optical signals, polishing the surfaces can prevent the optical signals from being dispersed. For this, a method such as electropolishing may be used, which can include the use of a common electrode 16 (see FIG. 4) and leads 18 (see FIG. 4), as already described above.

Next, a core 40 may be formed between the first reflective bump 12 and the second reflective bump 14 (S230). This process can be performed by substantially the same method as that used for operation S130 illustrated in FIG. 1. That is, a polymer resin layer 42 may be formed on one side of the first cladding 20 (S231), and the polymer resin layer 42 may be selectively removed (S232), to form the core 40. FIG. 12A shows an example of the core 40 formed between the first reflective bump 12 and the second reflective bump 14.

Next, a second cladding 50 may be stacked on the one side of the first cladding 20 to cover the first reflective bump 12, second reflective bump 14, and core 40 (S240). In this way, the core 40 may be covered by the first cladding 20 and the second cladding 50.

Next, pads 62 and a first circuit pattern (not shown) may be formed on one side of the second cladding 50 (S250). By forming the pads 62 and first circuit pattern (not shown) directly on the second cladding 50 which covers the core 40, the optical components 80a, 80b may be mounted directly on the optical waveguide, while the cladding 20, 50 may serve in a manner similar to the insulation layers in a typical package board.

Figure 12B:
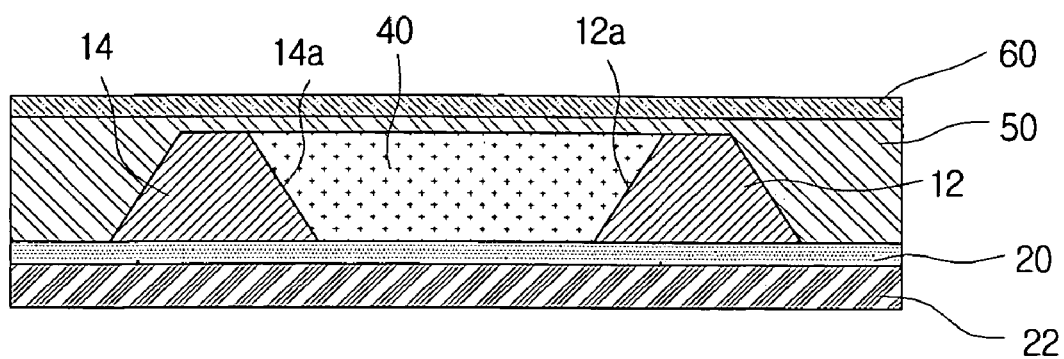
Figure 12C:
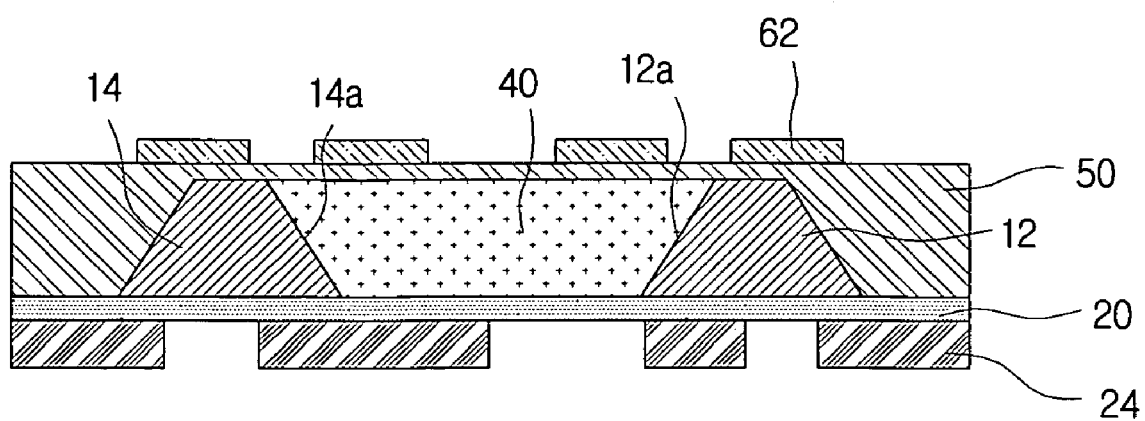
Figure 12D:
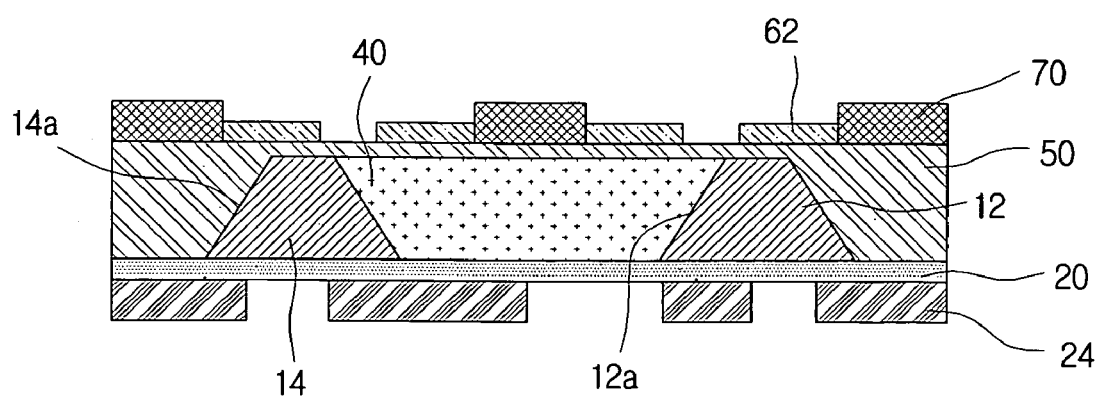

For this, a method may be used that includes stacking a metal layer 60 over the second cladding 50, as illustrated in FIG. 12B, and selectively etching the metal layer 60, as illustrated in FIG. 12C.

Furthermore, by selectively etching the carrier 22 coupled to the lower surface of the first cladding 20 as well, a circuit pattern 24 can be formed also on the lower surface of the first cladding 20 (S255). In this embodiment, to distinguish the circuit pattern (not shown) formed on the upper surface of the second cladding 50 from the circuit pattern 24 formed on the lower surface of the first cladding 20, the former will be referred to as a first circuit pattern, while the latter will be referred to as a second circuit pattern.

Figure 12E:
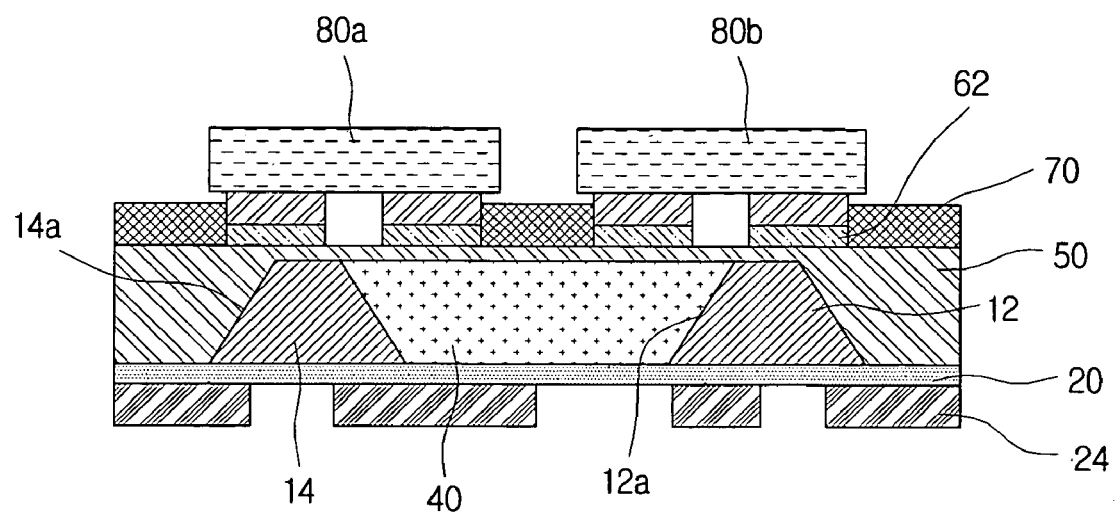
Figure 12F:
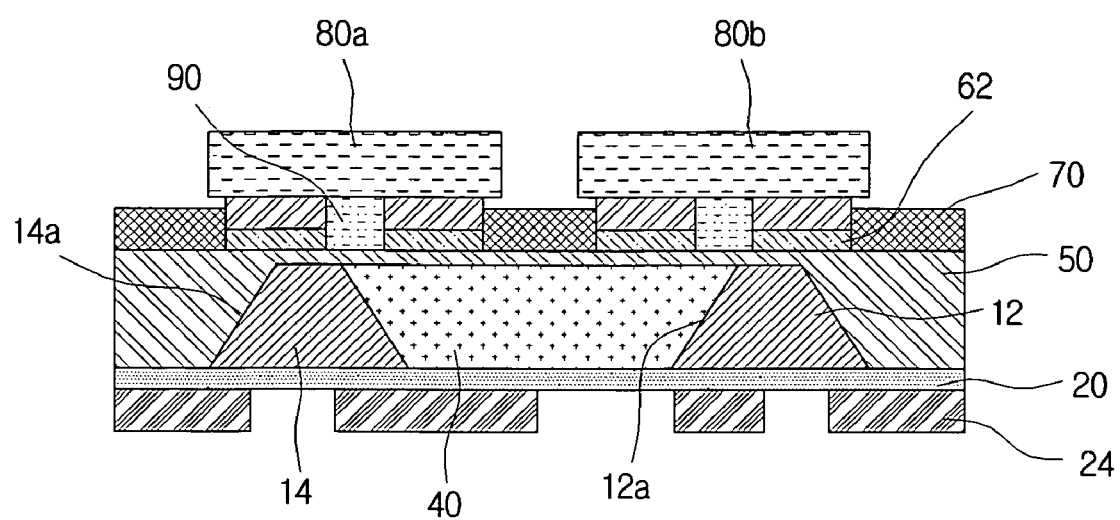

Next, as illustrated in FIG. 12E, optical components 80a, 80b may be placed on the pads 62 (S260). By forming the first circuit pattern (not shown) and pads 62 on the upper surface of the second cladding 50, and then placing the optical components 80a, 80b on the pads 62, a structure can be implemented that has optical components 80a, 80b mounted directly on the optical waveguide. In this way, the distance from the optical components 80a, 80b to the core 40 can be minimized, to minimize losses in the optical signals.

Prior to this, a solder resist 70 may be formed, as illustrated in FIG. 12D, to protect the first circuit pattern (not shown) formed on the upper surface of the second cladding 50.

Next, as illustrated in FIG. 12F, underfilling may be performed in the space between the optical components 80a, 80b and the second cladding 50, using a transparent material (S270). By forming the underfill 90 in the space between the optical components 80a, 80b and the second cladding 50, the optical components 80a, 80b can be mounted securely on the optical waveguide. The position where the underfill 90 is formed may be located in the path where the optical signals travel. As such, the underfill 90 can be made of a transparent material, in order that no obstructions occur in the transmission of optical signals.

A package board can be manufactured using the method described above, and the following will describe the structure of a package board manufactured by such a method, with reference to FIG. 12F.

The core 40 may serve as a path through which optical signals are transferred, and may be surrounded by the cladding 20, 50.

The cladding 20, 50 may surround the core 40 and may be designed to allow the efficient transmission of optical signals. As is the case with the core 40, the cladding 20, 50 can be made of a polymer based resin, and may have a lower refractive index compared to that of the core 40, for the efficient transmission of optical signals.

A reflective bump may be formed adjacent to an end portion of the core 40, and may serve to alter the paths of optical signals provided from an optical component 80a, 80b, etc., or transferred through the core 40. In this embodiment, the reflective bumps include first reflective bumps 12 and second reflective bumps 14, which are disposed with a predetermined gap in-between.

On the sides of the first reflective bump 12 and the second reflective bump 14 facing each other, inclined surfaces 12a, 14a can be formed which alter the paths of optical signals.

Thus, the optical signals provided from an optical component 80*a* on the left side may pass through the core 40 to be transmitted to an optical component 80*b* on the right side.

As described above, a common electrode 16 (see FIG. 4) and leads 18 (see FIG. 4) can be formed, so that electropolishing may be performed in a more efficient manner.

A circuit pattern 24 can be formed on the lower surface of the first cladding 20 and the upper surface of the second cladding 50, respectively, by which not only optical signals but also electrical signals may be transmitted.

The optical components 80*a*, 80*b* may be placed on the pads 62 formed on the upper surface of the second cladding 50. This structure can minimize the path from the optical components 80*a*, 80*b* to the core 40, thereby reducing losses in optical signals.

According to certain embodiments of the invention as set forth above, inclined surfaces can be formed by stacking a metal layer on the lower cladding and then selectively etching the metal layer, which can reduce lead time and enable a high degree of freedom in design.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above are encompassed within the scope of claims of the present invention.

What is claimed is:

1. A method of manufacturing an optical waveguide, the method comprising:
    forming a first reflective bump and a second reflective bump on one side of a first cladding, the first reflective bump and the second reflective bump each having an inclined surface formed thereon and disposed with a predetermined distance in-between, the inclined surfaces formed on opposing sides of the first reflective bump and the second reflective bump respectively;
    forming a core between the first reflective bump and the second reflective bump; and
    stacking a second cladding over the one side of the first cladding such that the second cladding covers the first reflective bump, the second reflective bump, and the core.

2. The method of claim 1, wherein forming the first reflective bump and the second reflective bump comprises:
    stacking a metal layer on the one side of the first cladding;
    forming an etching resist corresponding to the first reflective bump and the second reflective bump over one side of the metal layer;
    selectively etching the metal layer by applying an etchant to the metal layer; and
    removing the etching resist.

3. The method of claim 1, wherein forming the core comprises:
    forming a polymer resin layer on the one side of the first cladding; and
    selectively removing the polymer resin layer.

4. The method of claim 1, further comprising, before forming the core:
    polishing a surface of the first reflective bump.

5. The method of claim 4, further comprising, before the polishing:
    forming a common electrode on the one side of the first cladding;
    forming a first lead such that the first reflective bump and the common electrode are electrically connected; and
    forming a second lead such that the second reflective bump and the common electrode are electrically connected.

6. The method of claim 5, wherein the common electrode is formed along an edge of the first cladding.

7. An optical waveguide comprising:
    a first cladding;
    a first reflective bump and a second reflective bump each having an inclined surface formed thereon and disposed with a predetermined distance in-between, the inclined surfaces formed on opposing sides of the first reflective bump and the second reflective bump respectively;
    a core formed between the first reflective bump and the second reflective bump; and
    a second cladding stacked over the one side of the first cladding and covering the first reflective bump, the second reflective bump, and the core.

8. The optical waveguide of claim 7, wherein the first reflective bump contains a metal.

9. The optical waveguide of claim 8, further comprising:
    a common electrode formed on the first cladding;
    a first lead electrically connecting the first reflective bump and the common electrode; and
    a second lead electrically connecting the second reflective bump and the common electrode.

10. The optical waveguide of claim 9, wherein the common electrode is formed along an edge of the first cladding.

11. A method of manufacturing a package board, the method comprising:
    forming a first reflective bump and a second reflective bump on one side of a first cladding, the first reflective bump and the second reflective bump each having an inclined surface formed thereon and disposed with a predetermined distance in-between, the inclined surfaces formed on opposing sides of the first reflective bump and the second reflective bump respectively;
    forming a core between the first reflective bump and the second reflective bump;
    stacking a second cladding over the one side of the first cladding such that the second cladding covers the first reflective bump, the second reflective bump, and the core;
    forming a pad and a first circuit pattern on one side of the second cladding; and
    placing an optical component on the pad.

12. The method of claim 11, wherein forming the first reflective bump and the second reflective bump comprises:
    stacking a metal layer on the one side of the first cladding;
    forming an etching resist corresponding to the first reflective bump and the second reflective bump over one side of the metal layer;
    applying an etchant to the metal layer; and
    removing the etching resist.

13. The method of claim 11, wherein forming the core comprises:
    forming a polymer resin layer on the one side of the first cladding; and
    selectively removing the polymer resin layer.

14. The method of claim 11, further comprising, before forming the core:
    polishing a surface of the first reflective bump.

15. The method of claim 14, further comprising, before the polishing:
    forming a common electrode on the one side of the first cladding;

forming a first lead such that the first reflective bump and the common electrode are electrically connected; and forming a second lead such that the second reflective bump and the common electrode are electrically connected.

16. The method of claim 15, wherein the common electrode is formed along an edge of the first cladding.

17. The method of claim 11, further comprising:

performing underfilling using a transparent material in a space between the optical component and the second cladding.

18. The method of claim 11, further comprising, before forming the first reflective bump and the second reflective bump:

stacking a carrier on the other side of the first cladding, the carrier made from a metallic material.

19. The method of claim 18, further comprising:

forming a second circuit pattern by selectively etching the carrier.

20. A package board comprising:

a first cladding;

a first reflective bump and a second reflective bump each having an inclined surface formed thereon and disposed with a predetermined distance in-between, the inclined surfaces formed on opposing sides of the first reflective bump and the second reflective bump respectively;

a core formed between the first reflective bump and the second reflective bump;

a second cladding stacked over the one side of the first cladding and covering the first reflective bump, the second reflective bump, and the core;

a pad and a first circuit pattern formed on the second cladding; and an optical component placed on the pad.

21. The package board of claim 20, wherein the first reflective bump contains a metal.

22. The package board of claim 20, further comprising:

a common electrode formed on the first cladding;

a first lead electrically connecting the first reflective bump and the common electrode; and a second lead electrically connecting the second reflective bump and the common electrode.

23. The package board of claim 22, wherein the common electrode is formed along an edge of the first cladding.

* * * * *